United States Patent
Ryu et al.

(10) Patent No.: US 7,572,667 B2
(45) Date of Patent: Aug. 11, 2009

(54) METHOD OF FORMING AN ORGANIC SEMICONDUCTOR PATTERN AND METHOD OF MANUFACTURING AN ORGANIC THIN FILM TRANSISTOR USING THE SAME

(75) Inventors: Min-Seong Ryu, Suwon-si (KR); Bo-Sung Kim, Seoul (KR); Yong-Uk Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 461 days.

(21) Appl. No.: 11/336,028

(22) Filed: Jan. 20, 2006

(65) Prior Publication Data
US 2007/0172775 A1    Jul. 26, 2007

(51) Int. Cl.
*H01L 21/40* (2006.01)
(52) U.S. Cl. .................. 438/99; 438/82; 438/759; 438/780; 257/40; 257/642; 257/643; 156/442; 156/528; 216/36

(58) Field of Classification Search ............ 438/82, 438/99, 458, 780, 759; 257/40, 98, 642, 257/643, E51.005; 156/155, 247, 281, 344
See application file for complete search history.

(56) References Cited

U.S. PATENT DOCUMENTS

| | | | |
|---|---|---|---|
| 6,344,660 B1 * | 2/2002 | Dimitrakopoulos et al. | 257/40 |
| 6,838,776 B2 * | 1/2005 | Leal et al. | 257/783 |
| 6,966,997 B1 * | 11/2005 | Inganas et al. | 216/36 |
| 2002/0094594 A1 * | 7/2002 | Kim et al. | 438/30 |

* cited by examiner

*Primary Examiner*—Ha Tran T Nguyen
*Assistant Examiner*—Daniel Whalen
(74) *Attorney, Agent, or Firm*—Haynes and Boone, LLP.

(57) ABSTRACT

A method of forming an organic semiconductor pattern is provided. A pattern is formed on a first substrate. An adhesive is coated on the pattern to form an adhesive pattern. An organic semiconductor layer is formed on a second substrate. The second substrate is combined with the first substrate to remove a portion of the organic semiconductor layer attached to the pattern from the second substrate to form the organic semiconductor pattern.

24 Claims, 10 Drawing Sheets

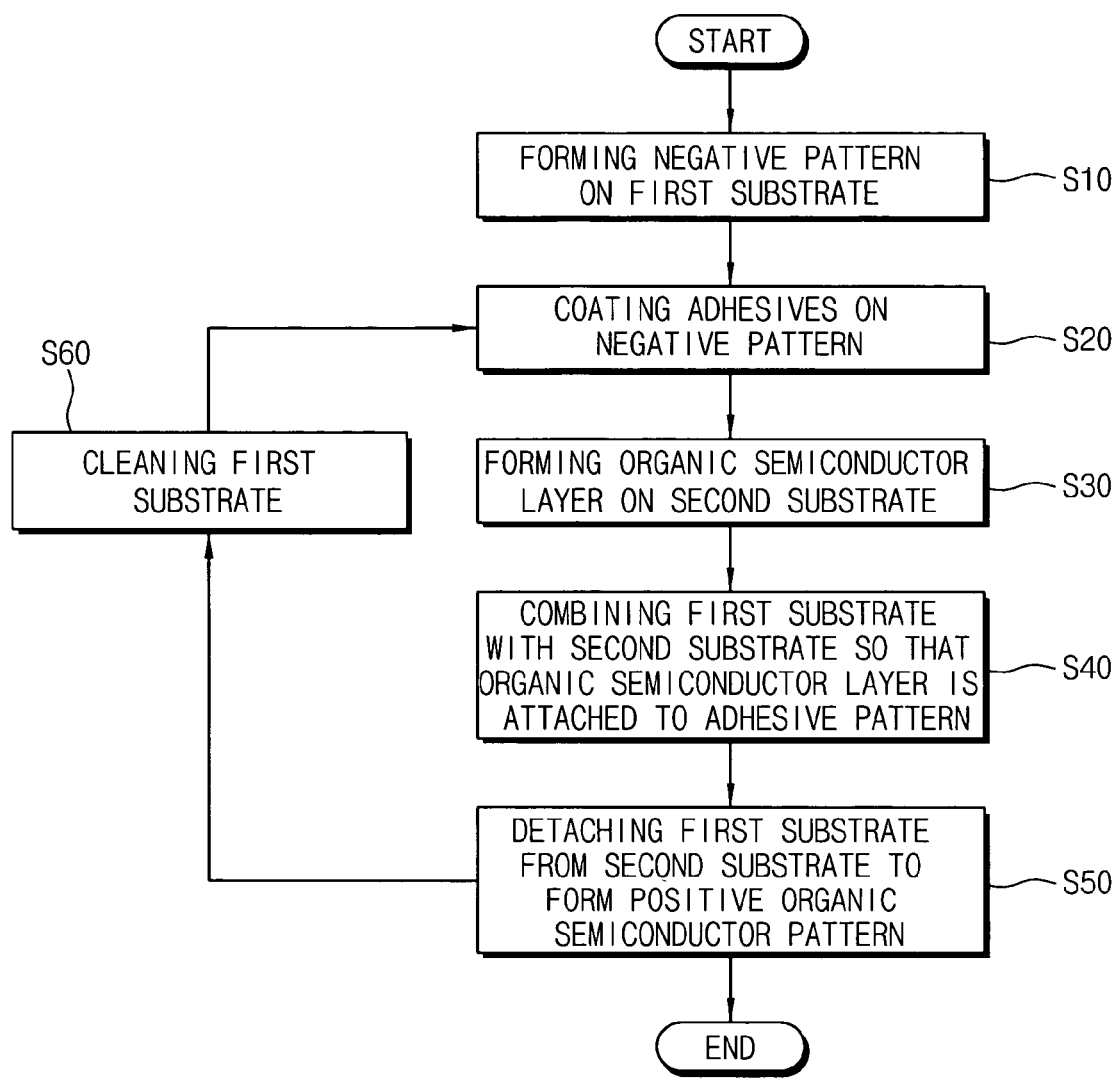

FIG. 5D
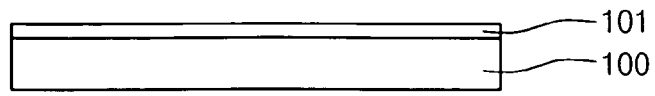
FIG. 5E
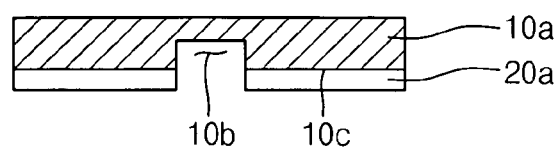
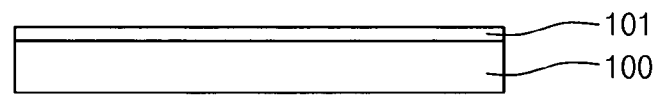
FIG. 5F
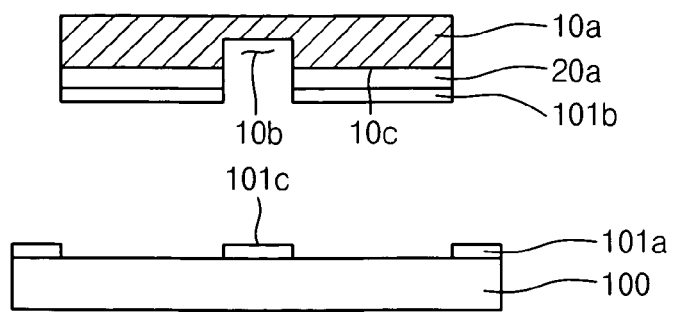

METHOD OF FORMING AN ORGANIC SEMICONDUCTOR PATTERN AND METHOD OF MANUFACTURING AN ORGANIC THIN FILM TRANSISTOR USING THE SAME

BACKGROUND OF THE INVENTION

1. Field of the Invention

The present invention relates to a method of forming an organic semiconductor pattern and a method of manufacturing an organic thin film transistor (TFT) using the method of forming the organic semiconductor pattern. More particularly, the present invention relates to a method of forming an organic semiconductor pattern to simplify a manufacturing process and a method of manufacturing an organic thin film transistor (TFT) using the method of forming the organic semiconductor pattern.

2. Description of the Related Art

A flat panel display device has advantageous characteristics such as being thinner, having a lighter weight, and being of a smaller size than a cathode ray tube display device. Flat panel display devices include a liquid crystal display (LCD) devices, field emission display (FED) devices, a plasma display panel (PDP) display device, and an electro-luminescence (EL) display device. The flat panel display device has been developed to improve an image display quality and to increase a screen size.

The PDP display device has a simple manufacturing process and a large screen. However, the PDP display device has higher power consumption than the LCD device. The LCD device of an active matrix type, which has a thin film transistor (TFT), is manufactured using a semiconductor manufacturing process. An electronic device such as a notebook computer, a television receiver, a mobile communication device, and similar items include an LCD device. However, typically the screen size of the LCD device is small, and the power consumption of a backlight assembly of the LCD device is high. In addition, an LCD device includes optical elements such as a polarizer, a prism sheet, and a diffusion plate, so that a luminance and a viewing angle of the LCD device are decreased. EL display devices are divided into two categories, an inorganic EL display device and an organic light emitting display (OLED) device. The inorganic EL display device includes an inorganic light emitting material. The OLED device includes an organic light emitting material. The EL display device is a light emissive type display device so that the response speed, luminance and viewing angle of the EL display device are greater than those of a light non-emissive type display device such as an LCD device.

A flexible display device of a high image display quality has been devised for mobile electronic devices. The flexible display device typically includes a display element having a low manufacturing cost, high flexibility, and high endurance. The display element of the flexible display device includes an organic semiconductor material. The organic semiconductor material includes polyacetylene that is a conjugate organic polymer, polyphenylenes, end-substituted thiophene oligomers, pentacent, phthalocyanine, and regioregularpoly(3-alkylthiophene)s.

The manufacturing processes used in making flexible display devices include a patterning process of the organic semiconductor material. The organic semiconductor material is easily molded to have a fiber shape or a film shape. The organic semiconductor material has various characteristics such as flexibility, electrical conductivity, and low manufacturing cost, so that an electric element or a photo element includes the organic semiconductor material.

Organic TFTs including the organic semiconductor material were developed in 1980s. An organic TFT has substantially the same structure as a silicon TFT, except for the channel layer which includes the organic semiconductor material. The organic TFT has a simpler structure and a lower manufacturing cost than a silicon TFTs. A Π-conjugated organic material has been used for the channel layer of the organic TFT. However, the Π-conjugated organic material has poor electrical characteristics. An organic TFT using the Π-conjugated organic material is not manufactured by a mass production, and is not resistant to oxygen and moisture, thereby decreasing the lifetime of the organic TFT.

The manufacturing process used to make an organic TFT includes a polymer semiconductor process and an organic semiconductor process. The polymer semiconductor process includes a high polymer as a semiconductor material. The semiconductor material used in the high polymer is dissolved in a solvent, and the dissolved semiconductor material is coated on a substrate using a spin coating method. The organic semiconductor process utilizes a low polymer as a semiconductor material. The semiconductor material used in the low polymer process is not dissolved in a solvent. The semiconductor material used in the low polymer includes a pentacene. Formula 1 represents a pentacene molecule which is an aromatic hydrocarbon having five benzene rings.

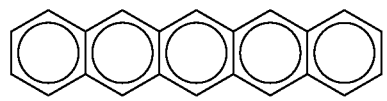

Formula 1

The pentacene molecule includes a plurality of single bonds and a plurality of double bonds so that an electron mobility in each of the pentacene molecules is high. However, electrons mobility between adjacent pentacene molecules through hopping so that an electron mobility out of the pentacene molecules is changed with respect to a degree of close-packing of the pentacene molecules. When the pentacene molecules are deposited in a vacuum, the pentancene molecules have high field effect mobility of the electrons (Synthetic metals, 41-43, 1127 (1991)). A precursor of the pentacene molecules dissolved in a solvent is coated to form the semiconductor layer. However, when the semiconductor layer is formed by the dissolved pentacene molecules, the characteristics of the semiconductor layer are deteriorated, and the dissolved pentancene molecules are heated at a high temperature of about 140° C. to about 180° C.

The organic semiconductor material is deposited on the substrate using a shadow mask. When the organic semiconductor material is deposited using a shadow mask, an etching process is unnecessary. However, shadow masks are not easily prepared.

For example, the thickness of the shadow mask is small and accordingly it is not easily handled. The shadow mask makes contact with the substrate during the deposition process so that the shadow mask is damaged during the deposition process, and a cleaning process is required for the shadow mask. Also, the shadow mask is not suitable for a large substrate. In addition, the shadow mask is expensive which, in turn, increases the manufacturing cost of the organic TFT.

SUMMARY OF THE INVENTION

The present invention provides a simplified method of forming an organic semiconductor pattern capable of simplifying a manufacturing process.

The present invention also provides a method of manufacturing an organic thin film transistor (TFT) using the above-mentioned method.

The present invention also provides a method of manufacturing a display element using the above-mentioned method.

A method of forming an organic semiconductor pattern in accordance with one aspect of the present invention is provided as follows. A pattern is formed on a first substrate. An adhesive is coated on the pattern to form an adhesive pattern. An organic semiconductor layer is formed on a second substrate. The second substrate is brought into contact with the first substrate to remove a portion of the organic semiconductor layer attached to the pattern from the second substrate.

The pattern formed on the first substrate corresponds to a negative pattern.

In accordance with some embodiments of the present invention, the method further comprises cleaning the first substrate to remove the adhesive pattern and the portion of the organic semiconductor layer attached to the pattern so that the cleaned first substrate can be reused.

Here, the first substrate is preferably cleaned using water, acetone, an ultrasonic wave or in a combination thereof.

In accordance with some embodiments of the present invention, the adhesive has a liquid phase, and the first substrate is dipped in the adhesive so that the adhesive is coated on the pattern.

In accordance with further embodiments of the present invention, the organic semiconductor layer includes an organic semiconductor material that is insoluble to a solvent.

A method of manufacturing an organic thin film transistor including a gate electrode, an insulating layer, a source electrode, a drain electrode and an organic semiconductor pattern in accordance with another aspect of the present invention is provided as follows. A pattern is formed on a first substrate. An adhesive is coated on the pattern to form an adhesive pattern. An organic semiconductor layer is formed on the second substrate. The second substrate is placed in contact with the first substrate to remove a portion of the organic semiconductor layer attached to the pattern from the second substrate so that the organic semiconductor pattern is formed on the second substrate.

In accordance with some embodiments of the present invention, when the substrate is flexible, a flexible device may be manufactured.

A method of manufacturing a display element having an organic thin film transistor including a gate electrode, an insulating layer, a source electrode, a drain electrode and an organic semiconductor pattern in accordance with still another embodiment of the present invention is provided as follows. A pattern is formed on a first substrate. An adhesive is coated on the pattern to form an adhesive pattern. An organic semiconductor layer is formed on the second substrate. The second substrate is combined with the first substrate to remove a portion of the organic semiconductor layer attached to the pattern from the second substrate so that the organic semiconductor pattern is formed on the second substrate.

A method of manufacturing a display element having an organic semiconductor pattern in accordance with still another embodiment of the present invention is provided as follows. A pattern is formed on a first substrate. An adhesive is coated on the pattern to form an adhesive pattern. An organic semiconductor layer is formed on a second substrate. The second substrate is combined with the first substrate to remove a portion of the organic semiconductor layer attached to the pattern from the second substrate.

The organic semiconductor pattern may be used for a flexible display element.

The display element may include an electro luminescence (EL) element, a liquid crystal display (LCD) device, an electrophoresis display device.

According to the present invention, the organic semiconductor pattern is formed through the printing process so that the shadow mask may be omitted. Therefore, a manufacturing process is simplified, and a manufacturing cost is decreased.

BRIEF DESCRIPTION OF THE DRAWINGS

The above and other advantages of the present invention will become more apparent in light of the following description of the exemplary embodiments thereof taken with reference to the accompanying drawings, in which:

FIG. 4 is a flow chart showing a method of forming an organic semiconductor pattern in accordance with another embodiment of the present invention;

FIGS. 5A to 5F are perspective and cross-sectional views showing a method of forming an organic semiconductor pattern in accordance with another embodiment of the present invention;

DESCRIPTION OF THE EMBODIMENTS

Figure 1:
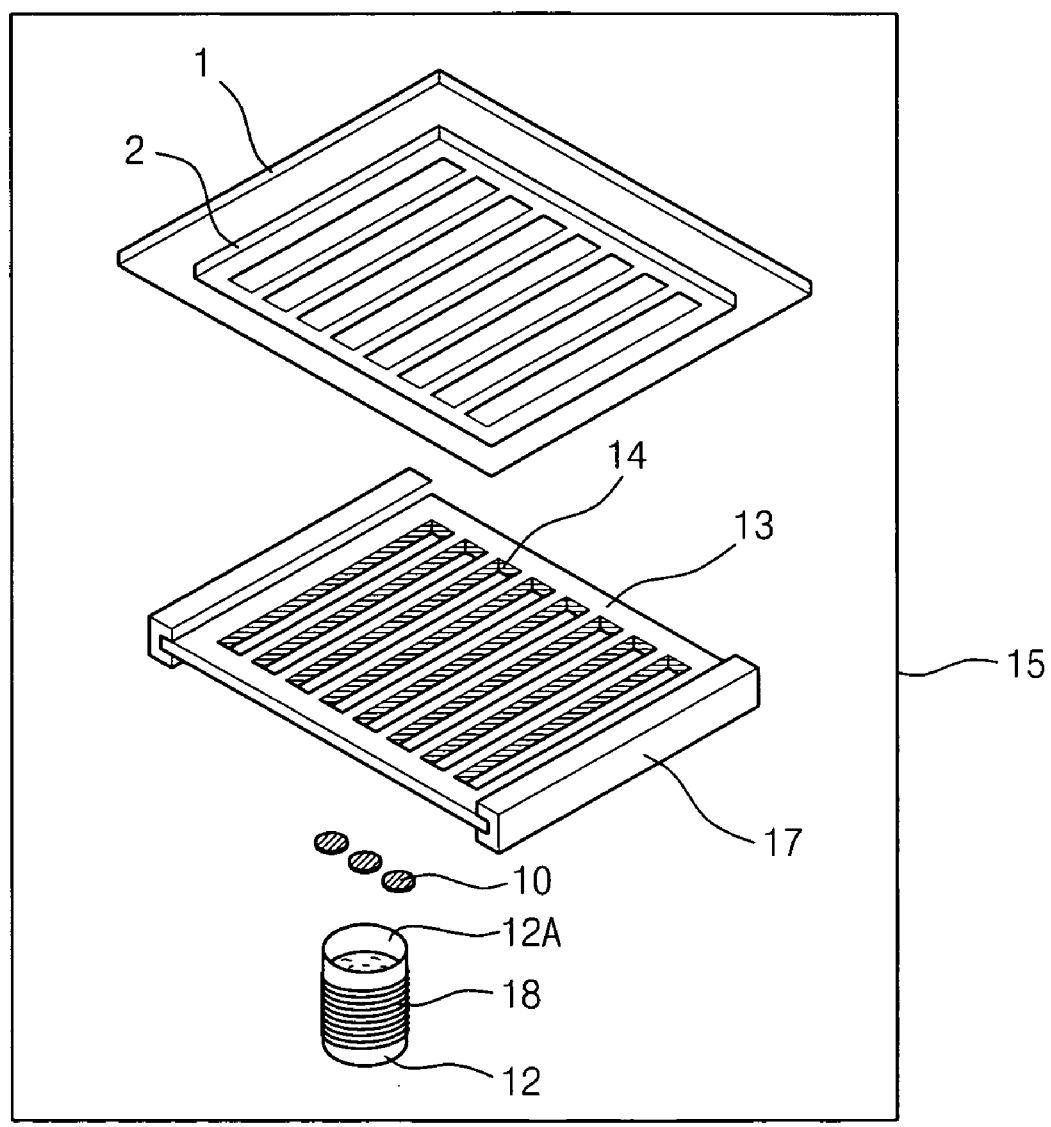
FIG. 1 is a perspective view showing a deposition process using a shadow mask in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, and third may be used herein to describe various elements, components, regions, layers and/or sections, these elements, components, regions, layers and/or sections should not be limited by these terms. These terms are only used to distinguish one element, component, region, layer or section from another region, layer or section.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are pictorial illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention is described below in detail with reference to the accompanying drawings.

Figure 2:
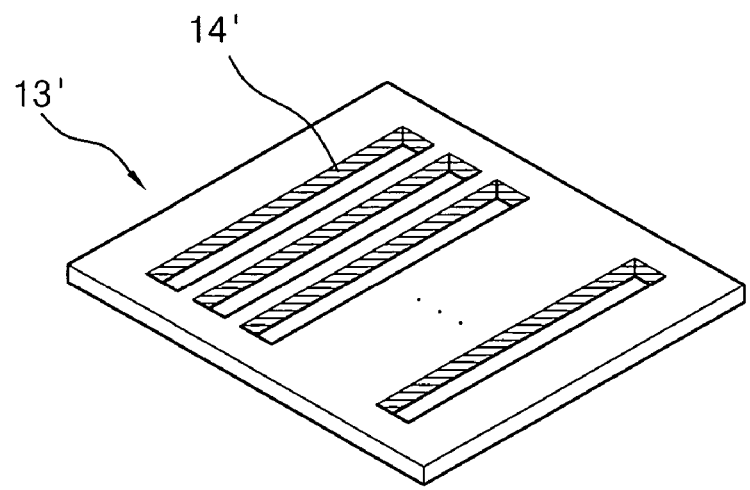
FIG. 2 is a perspective view showing slots of the shadow mask shown in FIG. 1.
Figure 3:
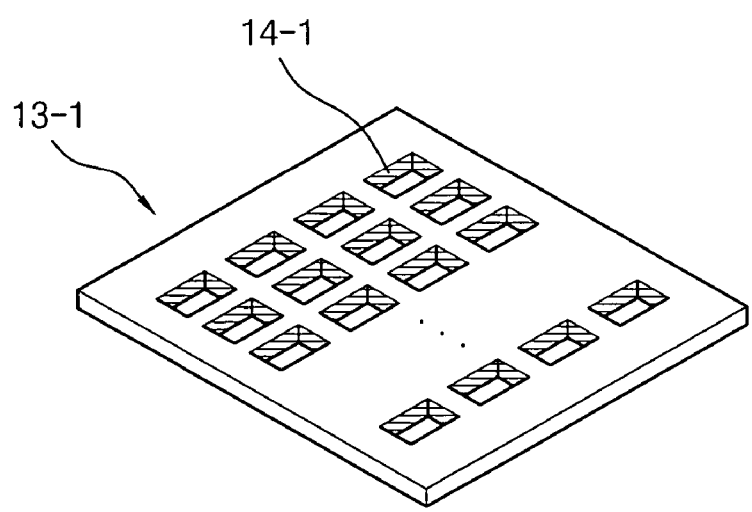
FIG. 3 is a perspective view showing slots of a shadow mask in accordance with another embodiment of the present invention.

In FIGS. 1 to 3, an organic semiconductor layer is deposited on a transparent anode electrode to form an organic semiconductor pattern through a vapor deposition process using a resistive heating.

FIG. 1 is a perspective view showing a deposition process using a shadow mask in accordance with one embodiment of the present invention.

Referring to FIG. 1, a vacuum deposition device includes a vacuum chamber 15, a heating container 12, a glass substrate 1 and a shadow mask 13. The heating container 12 is in the vacuum chamber 15 includes an organic material 10. The glass substrate 1 includes a transparent anode electrode 2. The shadow mask 13 is positioned between the heating container 12 and the glass substrate 1. The shadow mask 13 is spaced apart from the glass substrate 1 by a predetermined distance. A holder 17 holds the shadow mask 13 so that the shadow mask 13 is fixed to the vacuum deposition device.

The vacuum chamber 15 may be a vacuum state. Alternatively, the vacuum chamber 15 controls a pressure in the vacuum chamber 15. The heating container 12 receives the organic material 10, and has an opening 12A on an upper portion of the heating container 12. The heating container 12 is on a lower portion of the vacuum chamber 15. The organic material 10 is inserted into the heating container 12 through the opening 12A of the heating container 12. A resistor 18 surrounds the heating container 12 to heat the organic material 10 so that the heated organic material 10 may be evaporated. When a voltage is applied to the resistor 18, the heating container 12 is heated.

A transparent anode electrode 2 is formed on the glass substrate 1. The organic material 10 is deposited on the anode electrode 2 through the shadow mask 13. The shadow mask 13 may have various shapes.

FIG. 2 is a perspective view showing slots of the shadow mask shown in FIG. 1.

Referring to FIG. 2, the shadow mask 13' has a plurality of slots 14' arranged in a stripe shape so that the organic material 10 would be deposited on the glass substrate 1 in the stripe shape.

FIG. 3 is a perspective view showing slots of a shadow mask in accordance with another embodiment of the present invention.

Referring to FIG. 3, the shadow mask 13-1 has a plurality of slots 14-1 arranged in a matrix shape so that the organic material 10 would be deposited on the glass substrate 1 in the matrix shape.

A method of depositing the organic material 10 is described below.

The resister 18 heats the heating container 12 that is in the vacuum chamber 15. The organic material 10 in the heating container 12 evaporates at a temperature of higher than about 200° C.

When the organic material 10 evaporates from the heating container 12, the evaporated organic material 10 is deposited on the anode electrode 2 of the glass substrate 1 that has lower temperature than the heating container 12 through the slots 14 of the shadow mask 13. The shadow mask 13 is between the glass substrate 1 and the heating container 12. The shape of the deposited organic material 10 is determined by the shape of the slots 14 of the shadow mask 13.

The heat generated by the resister 18 is transmitted through the heating container 12, and the heat of the heating container 12 is radiated onto the shadow mask 13 so that a temperature of the shadow mask 13 is increased. With the increased temperature, the shadow mask 13 expands, and the expanded shadow mask 13 may sag in a downward direction. The amount of sag of shadow mask 13 increases as the size of the shadow mask increases.

Figure 5A:
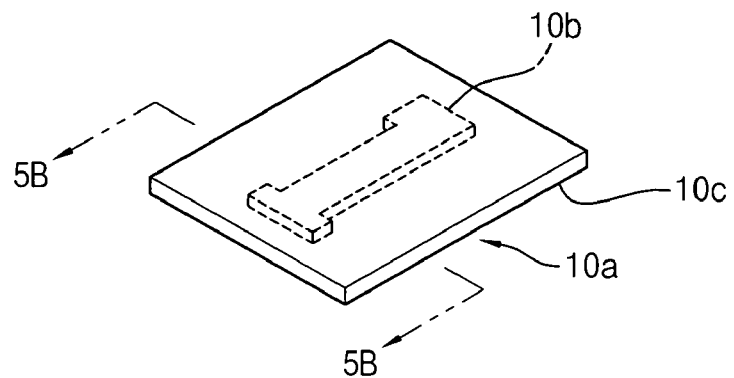

FIG. 4 is a flow chart showing a method of forming an organic semiconductor pattern in accordance with another embodiment of the present invention. FIG. 5A is a perspective view of substrate 10*a* which includes patterns 10*b*. FIGS. 5B through 5F are cross-sectional views showing steps in a method of forming an organic semiconductor pattern in accordance with another embodiment of the present invention.

Referring to FIG. 4, a negative pattern is formed on a first substrate step S10. The negative pattern is substantially opposite to the organic semiconductor pattern which is to be formed. An adhesive pattern is coated on the negative pattern (step S20). An organic semiconductor layer is formed on a second substrate (step S30). For example, the organic semiconductor layer may be deposited on an entire surface of the second substrate at a constant thickness. The first substrate having the adhesive on the negative pattern is combined with the second substrate having the organic semiconductor layer so that a portion of the organic semiconductor layer is attached to the adhesives of the negative pattern (step S40). The first substrate is detached from the second substrate to form the positive organic semiconductor pattern on the second substrate (step S50). In step S60 the first substrate is cleaned so that the adhesive and the remaining organic semiconductor layer are remove from the first substrate. Thus, the first substrate may be reused.

FIGS. 5A through 5F illustrate how the method disclosed and described above can be used to form on a substrate a semiconductor pattern defining the number 1. Briefly in the process an adhesive pattern is formed on a surface of a first substrate and a second substrate having a layer of semiconductor material is brought into contact with the adhesive pattern on the first substrate to remove portions of the semiconductor material from the second substrate to define the number 1 on the second substrate.

Referring to FIG. 5A, a pattern 10*b* of the number 1 is formed in first substrate 10*a* through well known photolithographic and etch processes. As will be appreciated by reference to FIGS. 5A and 5B, the pattern for the number 1 is recessed from surface 10*c*. Materials suitable for substrate 10*a* include metal, glass, and plastic.

Figure 5B:
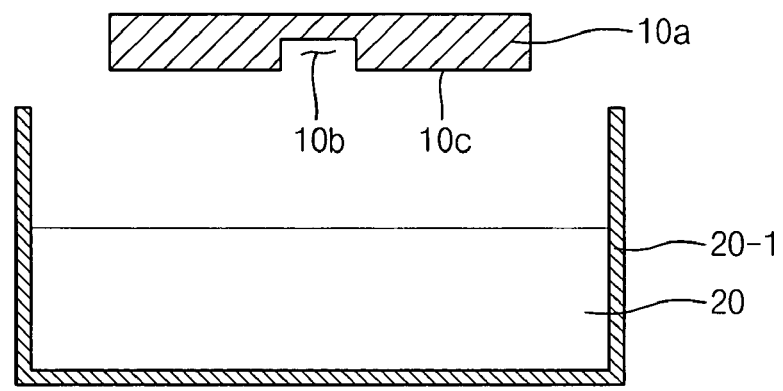

Referring to FIG. 5B, which is a cross-section taken along lines 5B-5B of FIG. 5A, an adhesive material indicated by reference character 20, which is included in container 20-1, is coated on surface 10*c* of the first substrate 10*a*. Surface 10*c* extends around the perimeter of the number 1 and forms what may be referred to as a negative pattern. The adhesive 20 may have a liquid phase. Surface 10*c* of first substrate 10*a* may be dipped in the adhesive 20 of the liquid phase. The adhesive 20 may have various materials. Adhesive 20 may be, for example, Screen Printable Adhesive manufactured by 3M Company in U.S.A. In FIG. 5B, the adhesive 20 is SP7533 manufactured by 3M Company in U.S.A. The SP7533 material is soluble in a water and accordingly can be easily removed from substrate 10*a*. Alternatively, the adhesive 20 may be Kraton manufactured by Shell Chemical Company in U.S.A. Kraton is soluble in an organic solvent and is easily removable from substrate 10*a*.

Figure 5C:
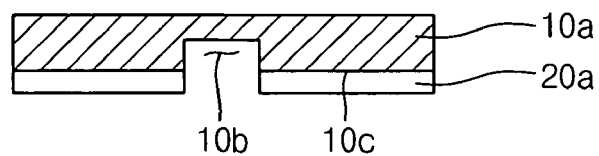

Referring to FIG. 5C, adhesive 20 is coated on the surface 10*c* of substrate 10*a* thus providing an adhesive pattern 20*a* which defines the area around the number 1.

Referring to FIG. 5D, an organic semiconductor layer 101 is formed on a second substrate 100. The organic semiconductor layer 101 may be formed on the second substrate 100 through well known deposition processes. Suitable materials for second substrate 100 include metal, glass and plastic. Additionally, second substrate 100 may be flexible. The organic semiconductor layer 101 includes an organic semiconductor material of a low polymer. The organic semiconductor material may include pentacene of Formula 1. Alternatively, the organic semiconductor layer 101 may be phthalocyanine, regioregularpoly(3-alkylthiophene)s, and end-substituted thiophene oligomers.

Referring to FIG. 5E, the first substrate 10*a* is being brought into contact with the second substrate 100 so that the adhesive pattern 20*a*, which is a negative of the ultimately desired pattern for number 1 touches organic semiconductor layer 101.

Referring to FIG. 5F, the first substrate 10*a* is separated from the second substrate 100 so that a portion of the organic semiconductor layer 101 surrounding pattern 10*b* is removed providing negative organic semiconductor pattern 101*b* on the adhesive pattern 20*a*, and leaving the positive organic semiconductor pattern 101*c* which defines the number 1 on the second substrate 100.

The adhesive pattern 20*a* and the negative organic semiconductor pattern 101*b* are removed from the first substrate 10*a* through a cleaning process. The first substrate 10*a* can then be reused. The cleaning process may be performed using water, acetone, or an ultrasonic cleaning process. For example, the first substrate 10*a* is cleaned using the water or the acetone in an ultrasonic wave.

When the pattern 10*b* is formed through a photolithographic process of a molding process, the first substrate 10*a* may be recycled for many times, thereby decreasing a manufacturing cost.

Hereinafter, an organic thin film transistor (TFT) is manufactured using the method of forming the organic semiconductor pattern.

Figure 6:
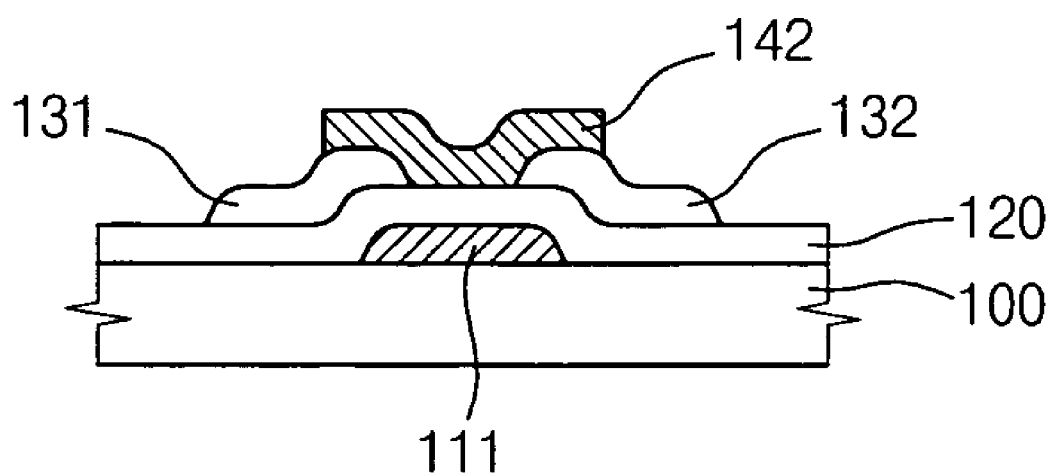
FIG. 6 is a cross-sectional view showing an organic thin film transistor (TFT) in accordance with another embodiment of the present invention.

FIG. 6 is a cross-sectional view showing an organic thin film transistor (TFT) in accordance with another embodiment of the present invention.

Referring to FIG. 6, a gate electrode 111 is formed on a substrate 100. The substrate 100 may be a flexible plastic material. Examples of the flexible plastic that can be used for the substrate 100 include polyethersulfone (PES), and polyethyleneteraphthalate (PET). The gate electrode 111 may be formed through a sputtering process, or an etching process. A dielectric organic material of a high dielectric constant is coated on the substrate 100 having the gate electrode 111. Examples of the dielectric organic material that can be coated on the substrate 100 having the gate electrode 111 include polyacrylonitrile, polyvinylidene fluoride (PVDF), and cyanoethylene pleural. The coated dielectric organic material is solidified to form a gate insulating layer 120. A source electrode 131 and a drain electrode 132 are formed on the gate insulating layer 120 for forming a TFT on the substrate 100. Examples of conductive materials that can be used for the gate electrode, the source electrode and the drain electrode include a metal, indium tin oxide (ITO), tin oxide (TO), indium zinc oxide (IZO), with impurity implants of polyaniline, polypyrrole, or polythiophene.

An organic semiconductor pattern 142 that forms a channel layer between the source electrode 131 and the drain electrode 132 is formed on the substrate 100 having the source electrode 131 and the drain electrode 132. A thickness of the organic semiconductor pattern 142 may be from about 10 nm to about 500 nm. The organic semiconductor pattern 142 may be formed through a substantially same method as shown in FIGS. 5 to 5F.

A protecting layer (not shown) such as a moisture proof layer or an oxygen proof layer may be formed on the organic semiconductor pattern 142 to protect the organic semiconductor pattern 142 from an externally provided impurity.

The amount of a current that flows between the source and drain electrodes 131 and 132 is controlled by a voltage that is applied to the gate electrode 111. In FIG. 6, the substrate 100 comprises a flexible plastic. Alternatively, the substrate 100 may comprise glass or silicon. In FIG. 6, the organic semiconductor pattern 142 is used to form the field effect transistor. Alternatively, the organic semiconductor pattern 142 may be used for various electric elements.

In FIG. 6, each of the organic TFT and the substrate 100 is flexible so that the display element having the organic TFT and the substrate 100 is also flexible. Therefore, a flexible display device having the flexible display element is provided.

According to the method shown in FIGS. 4 to 6, the organic TFT may be easily formed so that a display element having the organic TFT may also be easily manufactured. In addition, the manufacturing cost may be decreased.

Figure 7:
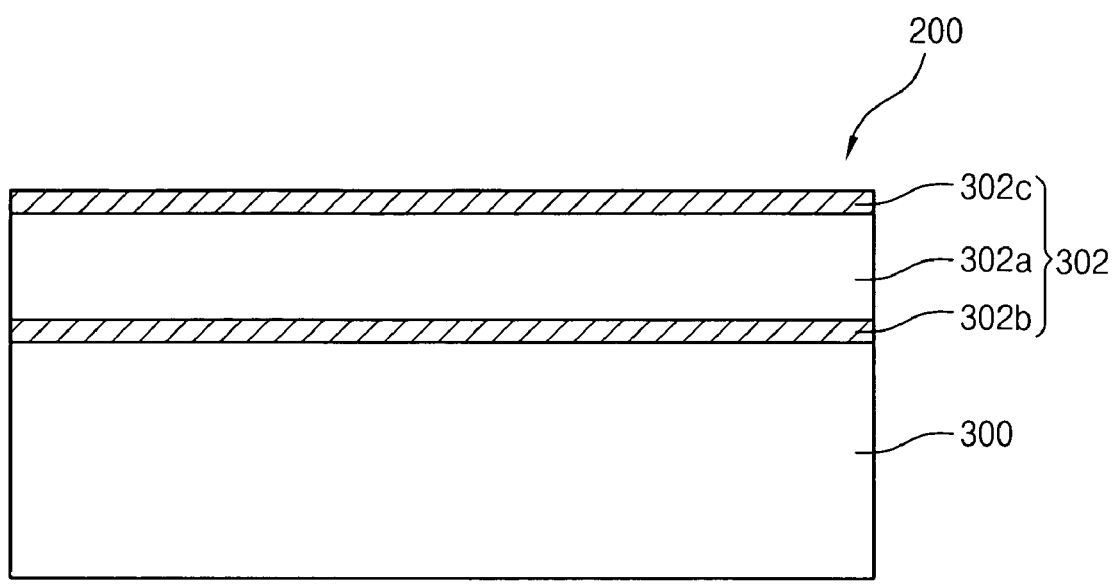
FIG. 7 is a cross-sectional view showing a display element in accordance with another embodiment of the present invention.

FIG. 7 is a cross-sectional view showing a display element in accordance with another embodiment of the present invention.

Referring to FIG. 7, the display element 200 includes an active display layer 302 and a power supply layer 300. The active display layer 302 may have various functions such as a channel layer, and a light emitting layer. The active display layer 302 includes a first display layer 302a, a first electrode 302b on a surface of the first display layer 302a and a second electrode 302c on another surface of the first display layer 302a. In FIG. 7, the active display layer 302 includes an organic semiconductor material.

That is, the organic semiconductor layer may be used for various electric elements such as the channel layer of the organic TFT, or the active display layer of the display element 200.

Hereinafter, various display elements are described.

An electro-luminescence (EL) element is classifiable into two types, (i) an inorganic EL element and (ii) an organic light emitting element. In the inorganic EL element, a high voltage is applied to electrodes of the inorganic EL element which accelerates electrons in an active layer of the inorganic EL element. The accelerated electrons impact molecules in the active layer and light is generated.

In the organic light emitting element, a negative charge from a cathode is combined with a positive charge from an anode to generate an exciton, thereby generating a light.

The required magnitude of a driving voltage for an inorganic EL element is from about 100V to about 200V. In contrast, the required driving voltage for an organic light emitting element is from about 5V to about 20V. Additionally, an organic light emitting display (OLED) device has other characteristics such as a high viewing angle, a high response speed, and a high contrast ratio.

OLED devices are classified into (i) an active matrix type OLED device and (ii) a passive matrix typed OLED device. The active matrix type OLED device includes a plurality of switching elements corresponding to a plurality of pixels so that the pixels may be independently operated. The switching elements may be thin film transistors. Described below is a structure of the active matrix type OLED device.

Figure 8:
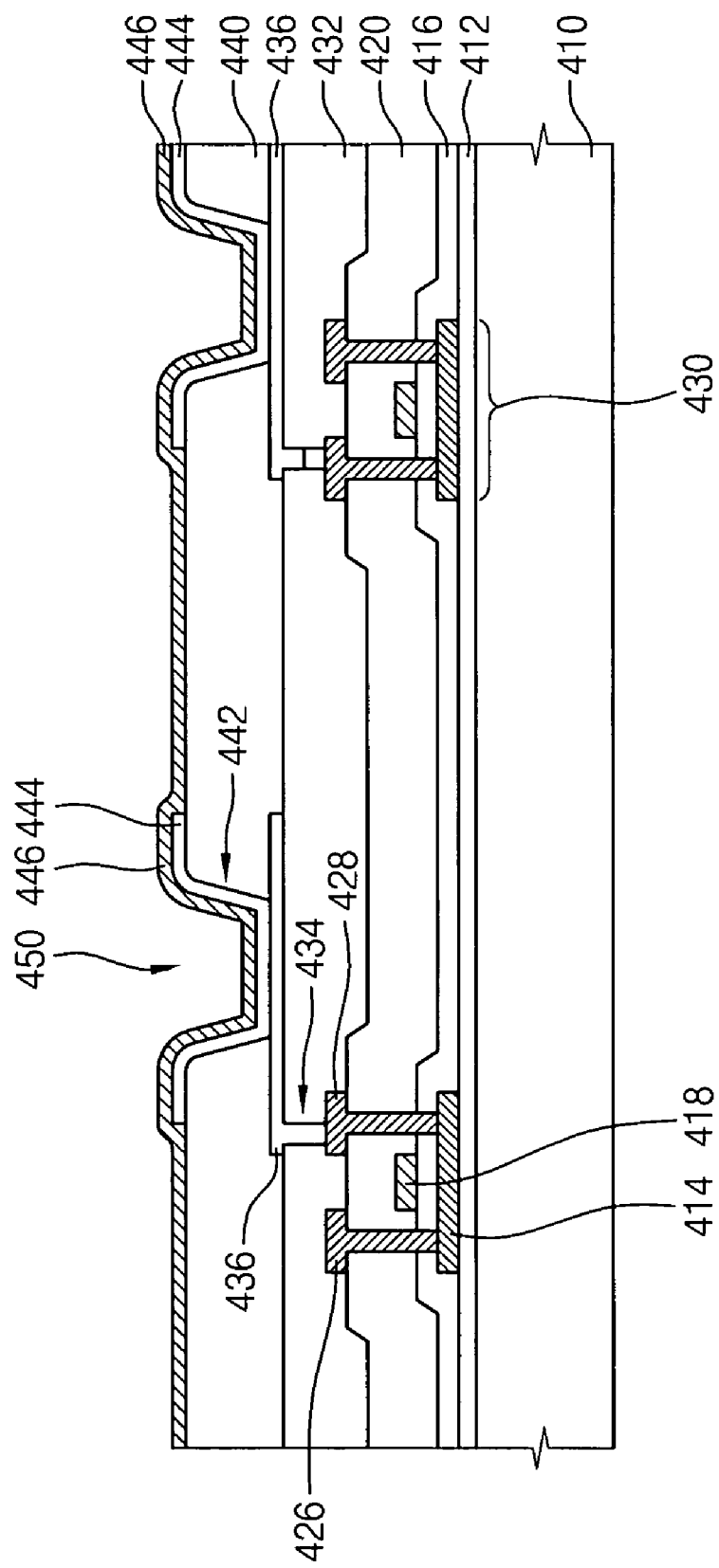
FIG. 8 is a cross-sectional view showing an organic light emitting element of the active matrix type in accordance with another embodiment of the present invention.

FIG. 8 is a cross-sectional view showing an organic light emitting element of the active matrix type in accordance with another embodiment of the present invention.

Referring to FIG. 8, a blocking layer 412 is formed on an insulating substrate 410. The blocking layer 412 may be a silicon oxide. Examples of insulating materials that can be used for the insulating substrate 410 include glass, quartz, sapphire, and plastic. The insulating substrate 410 along with blocking layer 412 supports the organic light emitting element. The insulating substrate 410 may be transparent. Examples of the plastic that can be used for the insulating substrate 410 include polyethyleneteraphthalate (PET), polycarbonate (PC), polyethersulfone (PES), polymethylemethacrylate, polysumfone, polybuten, and polymethylpentene. The blocking layer 412 protects an amorphous silicon layer that will be formed on the blocking layer 412 from impurities that may be in the insulating substrate 410. Alternatively, the blocking layer 412 may be omitted. A thin film transistor (TFT) 430 is formed on the blocking layer 412.

The TFT 430 includes an active pattern 414, a gate insulating layer 416, a gate electrode 418, an insulating interlayer 420, a source electrode 426 and a drain electrode 428. The active pattern 414 may be formed through the method shown in FIGS. 4 to 5F. Thus, any further explanations concerning the above elements will be omitted.

A protective layer 432 is formed on an entire surface of the insulating substrate 410 having the TFT 430. The protective layer 432 includes a contact hole 434 through which one of the source and drain electrodes 426 and 428 is partially exposed. A pixel electrode 436 is formed on the protecting layer 432. The pixel electrode 426 is electrically connected to the one of the source and drain electrodes 426 and 428 through the contact hole 434. The pixel electrode 436 comprises a transparent conductive material, and functions as an anode of the organic light emitting element 450. Examples of the transparent conductive material that can be used for the pixel electrode 436 include indium tin oxide (ITO), and indium zinc oxide (IZO).

An organic insulating layer 440 is formed on the protective layer 432 which supports the pixel electrode 436. The organic insulating layer 440 includes opening 442 through which the pixel electrode 436 is partially exposed. An organic light emitting layer 444 is formed on the opening 442. A metal electrode 446 is applied to organic light emitting layer 444. The metal electrode 446 functions as a cathode of the organic light emitting element 450. The organic light emitting layer 444 may be formed through the printing process shown in FIGS. 4 to 7. Thus, any further explanation concerning processes for producing the above elements is not required.

Described below is a liquid crystal display (LCD) device including an organic TFT.

Figure 9:
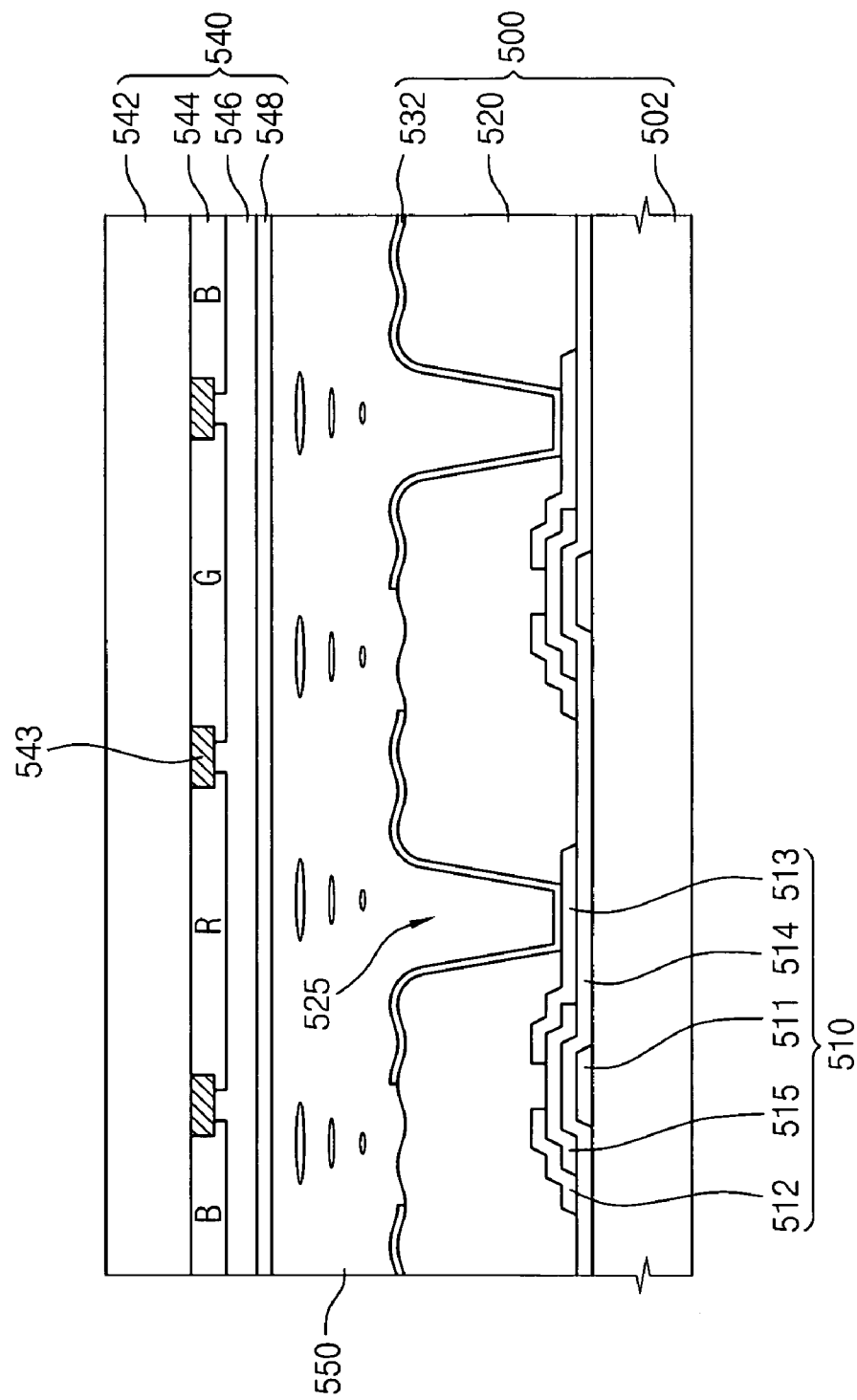
FIG. 9 is a cross-sectional view showing a liquid crystal display (LCD) device in accordance with another embodiment of the present invention.

FIG. 9 is a cross-sectional view showing a liquid crystal display (LCD) device in accordance with another embodiment of the present invention.

Referring to FIG. 9, the TFT device includes a TFT substrate 500, a color substrate 540 and a liquid crystal layer 550. The TFT substrate 500 includes a plurality of thin film transistors arranged in a matrix. The color filter substrate 540 cooperates with the TFT substrate 500. The liquid crystal layer 550 is interposed between the TFT substrate 500 and the color filter substrate 540.

The TFT substrate 500 includes a first glass substrate 502 and a plurality of pixels arranged in the matrix. Each of the pixels includes a thin film transistor 510, an organic insulating layer 520 and a pixel electrode 532. The thin film transistor 510 are supported on the first glass substrate 502. Organic insulating layer 520 is also supported on the first glass substrate 502 along with the thin film transistors 510. The pixel electrodes 532 are on the organic insulating layer 520. Each of the pixel electrodes 532 is electrically connected to each of the thin film transistors 510. The pixel electrodes 532 transmit a light. The TFT substrate 500 may further include a plurality of gate lines (not shown) and a plurality of data lines (not shown).

Each of the thin film transistors 510 includes a gate electrode 511, a source electrode 512 and a drain electrode 513. The gate electrode 511 is electrically insulated from the source and drain electrodes 512 and 513 respectively by gate insulating layer 514. An active pattern 515 is formed on the gate insulating layer 514 corresponding to the gate electrode 511. When a voltage is applied to the gate electrode 511, a channel is formed in the active pattern 515 so that the source electrode 512 is electrically connected to the drain electrode 513. The source and drain electrodes 512 and 513 are supported on the active pattern 515, and spaced apart from each other.

The organic insulating layer 520 extends between the thin film transistors 510 and the pixel electrode 532. The organic insulating layer 520 includes a contact hole 525 through which the drain electrode 513 is partially exposed. The pixel electrode 532 is electrically connected to the drain electrode 513 through the contact hole 525 and pixel electrodes 532 are on the organic insulating layer 520.

The pixel electrodes 532 include a transparent conductive material. Examples of suitable transparent conductive materials that can be used for the pixel electrodes 532 include indium tin oxide (ITO), and indium zinc oxide (IZO). Pixel electrodes 532 have a constant thickness.

The color filter substrate 540 includes a second glass substrate 542, a black matrix 543, a color filter 544, an overcoating layer 546 and a common electrode 548. The black matrix 543 is supported on the second glass substrate 542 to block a portion of light passing a region between adjacent pixel electrodes 532. The color filter 544 is also supported on the second glass substrate 542. The overcoating layer 546 covers the black matrix 543 and the color filter 544. The common electrode 548 is supported on the overcoating layer 546.

Particularly, the color filter 544 includes a red color filter portion that transmits a red portion of the light, a green color filter portion that transmits a green portion of the light, and a blue color filter portion that transmits a blue portion of the light.

In FIG. 9, the color filter 544 partially overlaps with the black matrix 543 to form a stepped portion between the color filter 544 and the black matrix 543. The overcoating layer 546 planarizes the stepped portion of the color filter substrate 540. The common electrode 548 which is supported on the overcoat layer 546 has a constant thickness. The common electrode 548 includes a transparent conductive material. Examples of suitable materials for the transparent conductive material for the common electrode 548 include indium tin oxide (ITO), and indium zinc oxide (IZO). The overcoating layer 546 includes an acrylic resin or a polyamide resin.

The active pattern 515 can be formed using the printing method shown in FIGS. 4 to 5F. When the active pattern 515 is formed through the printing method, the active pattern 515 may be formed on a large screen LCD device.

Described below is a display device having a printable display element which comprises an electric paper element.

Figure 10:
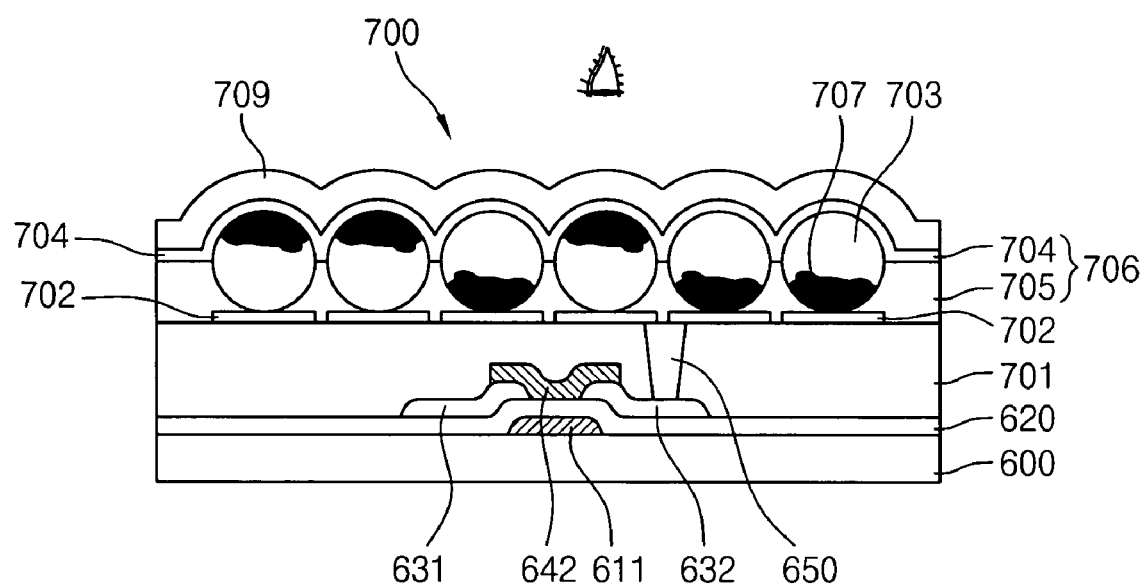
FIG. 10 is a cross-sectional view showing a display element of an electrophoresis display layer.

FIG. 10 illustrates a cross-sectional view of a display element using an electrophoresis display layer.

In an electrophoresis display device, a microcapsule which includes electrophoretic particles interposed between transparent electrodes. When a positive voltage is applied to one of the transparent electrodes, light passes through the electrophoretic particles. When a negative voltage is applied to one of the transparent electrodes, light does not pass through the electrophoretic particles. In FIG. 10, the electrophoresis display device includes an organic TFT of the type shown in FIG. 6. Thus, any further explanations concerning the above elements will be omitted.

Referring to FIG. 10, the electrophoresis display device 700 includes a plurality of individual electrodes 702, a plurality of microcapsules 703 and a common electrode 704. Each of the microcapsules 703 is fixed to each of the individual electrodes 702 through an adhesive layer 705. The microcapsules 703 include the electrophoresis particles 707. The microcapsules 703 and the adhesive layer 705 form a display layer 706. The common electrode 704 covers the display layer 706. The individual electrodes 702 are positioned beneath the common electrode 704. The common electrode 704 includes a transparent conductive material. The common electrode 704 is on a viewer's side of the electrophoresis display device 700. An organic TFT is electrically connected to each of the individual electrodes 702. Each TFT is supported on a substrate, and includes a gate electrode 611, a gate insulating layer 620, a source electrode 631, a drain electrode 632 and an organic semiconductor pattern 642. The drain electrode 632 of the TFT is electrically connected to each of the individual electrodes 702 through a contact hole 650 in insulating layer 701.

When a voltage difference is formed between the common electrode 704 and each of the individual electrodes 702, an arrangement of the electrophoretic particles 707 in the microcapsules 703 is changed, thereby displaying an image.

When the electrophoresis display device 700 includes the TFT having the organic semiconductor pattern 642, a size of the electrophoresis display device 700 may be increased. That is, the electrophoresis display device 700 may have a large screen.

According to the method shown in FIGS. 4 to 10, the organic semiconductor pattern and the organic TFT may be easily formed.

According to the present invention, a flexible display device includes an organic semiconductor material so that a manufacturing process is simplified.

The organic semiconductor pattern is formed through the printing process so that use of a shadow mask is not required, thus avoiding the above-described disadvantage of a shadow mask.

In addition, the size of the screen of the display device may be increased. Furthermore, the image display quality of the display device may be improved.

This invention has been described with reference to the exemplary embodiments. It is evident, however, that many alternative modifications and variations will be apparent to those having skill in the art in light of the foregoing description. Accordingly, the present invention embraces all such alternative modifications and variations as fall within the spirit and scope of the invention.

What is claimed is:

1. A method of forming a prespecified organic semiconductor pattern on a second of supplied first and second substrates, comprising:
   forming on the first substrate a pattern having at least one recess and at least one mesa;
   selectively coating an adhesive on the at least one mesa of the pattern to thereby form an adhesive pattern having a shape corresponding to a shape of the at least one mesa;
   forming an organic semiconductor layer on the second substrate; and bringing the second substrate into contact with the first substrate so that the adhesive pattern directly touches the organic semiconductor layer and thereafter separating the first and second substrates so as to thereby selectively remove from the second substrate a portion of the organic semiconductor layer directly touched by and adhesively attached to the adhesive pattern to thereby form the prespecified organic semiconductor pattern.

2. The method of claim 1, wherein the at least one mesa provided in the pattern formed on the first substrate defines a negative pattern corresponding to the portion of the organic semiconductor layer which is selectively removed by said separating step.

3. The method of claim 1, wherein the adhesive is water soluble.

4. The method of claim 1, wherein the adhesive is soluble in an organic solvent.

5. The method of claim 1, further comprising cleaning the first substrate to remove from the at least one mesa the adhesive pattern and the portion of the organic semiconductor layer attached to the adhesive pattern.

6. The method of claim 5, wherein the portion of the organic semiconductor layer which is selectively removed by said separating step and removed by said cleaning step defines a negative pattern that complements a countering positive defined by the prespecified organic semiconductor pattern.

7. The method of claim 5, wherein said cleaning of the first substrate includes using at least one of water, acetone, and an ultrasonic wave.

8. The method of claim 1, wherein said selective coating of the adhesive on the at least one mesa of the pattern comprises dipping the first substrate in a liquid phase adhesive material.

9. The method of claim 1, wherein the organic semiconductor layer comprises an organic semiconductor material which is substantially insoluble by a prespecified solvent, which solvent can be used to dissolve the selectively coated on adhesive.

10. The method of claim 9, wherein the organic semiconductor material comprises pentacene.

11. A method of manufacturing an organic thin film transistor including a gate electrode, an insulating layer, a source electrode, a drain electrode and a patterned organic semiconductor layer having a prespecified pattern, wherein the patterned organic semiconductor layer is formed by:
  forming on a first substrate a first pattern having at least one recess and at least one mesa, where the at least one recess has a pattern corresponding to the prespecified pattern of the organic semiconductor layer;
  selectively coating an adhesive on the at least one mesa of the first pattern to thereby form an adhesive pattern having a shape corresponding to a shape of the at least one mesa;
  forming an organic semiconductor layer on a second substrate; and
  bringing the second substrate into contact with the first substrate so that the adhesive pattern directly touches the organic semiconductor layer and thereafter separating the first and second substrates so as to thereby selectively remove from the second substrate a portion of the organic semiconductor layer directly touched by and adhesively attached to the adhesive pattern to thereby form the prespecified pattern of the patterned organic semiconductor layer.

12. The method of claim 11, wherein the at least one mesa provided in the pattern formed on the first substrate defines a negative pattern corresponding to the portion of the organic semiconductor layer which is selectively removed by said separating step.

13. The method of claim 11, wherein the second substrate is comprised of a flexible plastic material.

14. The method of claim 11, further comprising cleaning the first substrate wherein said cleaning includes selectively removing from the first substrate the adhesive pattern and the portion of the organic semiconductor layer attached to the adhesive pattern.

15. The method of claim 14, wherein the portion of the organic semiconductor layer which is selectively removed by said separating step and removed by said cleaning step defines a negative pattern that complements a countering positive defined by the prespecified pattern of the patterned organic semiconductor layer.

16. The method of claim 14, wherein the selective removing from the first substrate of the adhesive pattern comprises using at least one of water, acetone, and an ultrasonic wave.

17. The method of claim 11, wherein said selective coating of the adhesive on the at least one mesa of the first pattern comprises dipping the first substrate in a liquid form of the adhesive so that the adhesive coats the at least one mesa of the first pattern.

18. The method of claim 11, wherein the organic semiconductor layer comprises an organic semiconductor material which is substantially insoluble by a prespecified solvent, which solvent can be used to dissolve the selectively coated on adhesive.

19. The method of claim 18, wherein the organic semiconductor material comprises pentacene.

20. A method of manufacturing a display element having an organic thin film transistor including a gate electrode, an insulating layer, a source electrode, a drain electrode and a patterned organic semiconductor layer having a prespecified pattern, wherein the patterned organic semiconductor layer is formed by:
  forming on a first substrate a first pattern having at least one recess and at least one mesa, where the at least one recess has a pattern corresponding to the prespecified pattern of the organic semiconductor layer:
  selectively coating an adhesive on the at least one mesa of the first pattern to thereby form an adhesive pattern having a shape corresponding to a shape of the at least one mesa;
  forming an organic semiconductor layer on a second substrate; and
  combining the second substrate with the first substrate and thereafter separating the first and second substrates to thereby remove from the second substrate a portion of the organic semiconductor layer which in the combining step becomes directly attached to the adhesive pattern so that the patterned organic semiconductor layer is formed on the second substrate.

21. The method of claim 20, wherein the at least one mesa provided in the first pattern formed on the first substrate defines a negative pattern corresponding to the portion of the organic semiconductor layer which is selectively removed by said separating step.

22. The method of claim 20, wherein the display element is an electro luminescence (EL) element, a liquid crystal display (LCD) element or an electrophoresis display element whose display state is controlled by the organic thin film transistor.

23. A method of manufacturing a display device which includes a patterned organic semiconductor layer, wherein the pattern of the organic semiconductor layer is prespecified and is formed by:

forming on a first substrate, a first pattern having at least one recess and at least one mesa:

selectively coating an adhesive onto the at least one mesa of the first pattern to thereby form an adhesive pattern;

forming an organic semiconductor layer on a second substrate; and bringing the second substrate into contact with the first substrate so that the adhesive pattern directly contacts and adheres to the organic semiconductor layer and thereafter separating the first and second substrates to thereby selectively remove from the second substrate a portion of the organic semiconductor layer directly contacted by and adhesively attached to the adhesive pattern and to thereby selectively leave behind on the second substrate said patterned organic semiconductor layer.

24. The method of claim 23, wherein the display device includes a plurality of display elements each including a thin film transistor comprising a portion of the patterned organic semiconductor layer and wherein each display element defines is an electro luminescence (EL) element, a liquid crystal display (LCD) element or an electrophoresis display element.

* * * * *